US012560684B2

(12) United States Patent
Satter et al.

(10) Patent No.: US 12,560,684 B2
(45) Date of Patent: Feb. 24, 2026

(54) OPTICAL AMPLIFIER WITH INTEGRATED WAVELENGTH-SELECTIVE SWITCHING

(71) Applicant: Intel Corporation, Santa Clara, CA (US)

(72) Inventors: Md. Mahbub Satter, Santa Clara, CA (US); David Mathine, Albuquerque, NM (US); Jonathan Doylend, Morgan Hill, CA (US)

(73) Assignee: Intel Corporation, Santa Clara, CA (US)

( * ) Notice: Subject to any disclaimer, the term of this patent is extended or adjusted under 35 U.S.C. 154(b) by 731 days.

(21) Appl. No.: 17/848,432

(22) Filed: Jun. 24, 2022

(65) Prior Publication Data

US 2022/0326351 A1 Oct. 13, 2022

(51) Int. Cl.
| | |
|---|---|
| *G01S 7/48* | (2006.01) |
| *G02B 6/35* | (2006.01) |
| *H01S 5/50* | (2006.01) |
| *H04Q 11/00* | (2006.01) |

(52) U.S. Cl.
CPC ............ *G01S 7/4804* (2013.01); *G02B 6/356* (2013.01); *H01S 5/50* (2013.01); *H04Q 11/0005* (2013.01); *H04Q 2011/0015* (2013.01)

(58) Field of Classification Search
None
See application file for complete search history.

(56) References Cited

U.S. PATENT DOCUMENTS

| | | | |
|---|---|---|---|
| 5,396,507 A | 3/1995 | Kaminow et al. | |
| 2002/0159141 A1 | 10/2002 | Choa | |
| 2017/0153319 A1 | 6/2017 | Villeneuve et al. | |
| 2022/0320832 A1* | 10/2022 | Koch | G02B 6/2808 |

FOREIGN PATENT DOCUMENTS

EP 2437087 A1 4/2012

* cited by examiner

*Primary Examiner* — David W Lambert
(74) *Attorney, Agent, or Firm* — Viering, Jentschura & Partner mbB

(57) ABSTRACT

Disclosed herein are devices, methods, and systems for selectively amplifying optical signals using an optical circuit. The optical circuit includes an input port to receive a plurality of input laser signals and a switching array connected to the input port. The switching array includes a plurality of switching optical amplifiers configured to amplify a laser signal of the plurality of input laser signals as an amplified laser signal and absorb the remaining of the plurality of input laser signals. The optical circuit also includes a splitting circuit connected to the switching array. The splitting circuit is configured to split the amplified laser signal into a plurality of output laser signals.

20 Claims, 5 Drawing Sheets
(1 of 5 Drawing Sheet(s) Filed in Color)

100

OPTICAL AMPLIFIER WITH INTEGRATED WAVELENGTH-SELECTIVE SWITCHING

TECHNICAL FIELD

The disclosure relates generally to optical circuits that operate to amplify light signals at multiple different wavelengths for use in various applications, including, for example light detection and ranging (LiDAR) applications.

BACKGROUND

Optical circuits may be used to amplify light signals, where incident light at the input is amplified and provided to an output of the optical amplifier. In many applications that use optical amplifier circuits, including, for example light detection and ranging (LiDAR) applications, the incident light signals may arrive to the optical amplifier circuit at multiple different wavelengths simultaneously, each of which may need to be amplified selectively, where the optical amplifier circuits may need to be tuned to amplify only one individual wavelength at a given time. In a chip-based implementation of a typical optical amplifier circuit (e.g., in a photonic integrated chip or PIC), semiconductor-based optical amplifiers (also known as semiconductor optical amplifiers or SOAs) may be used to amplify the incident light. In a LiDAR application, for example, the light source (s) may emit pulses of light at multiple different wavelengths, where each wavelength may target different parts of the field of view simultaneously. To accurately measure the different parts of the field of view, the optical amplifier circuit selects only one of the multiple different optical wavelengths of incident light for amplification at a given time. In such cases, the optical amplifier circuit may switch between amplifying one optical wavelength at one time and then amplifying a different optical wavelength at the next time so as to individually render the field of view associated with each wavelength. If more than one optical wavelength of the incident light is allowed to pass through the optical amplifier circuit at the same time, this could manifest as illumination and/or reflections from non-targeted portions of the field of view, ghost signals, and/or degraded signal-to-noise ratio, all of which may negatively impact performance.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

Figure 1:
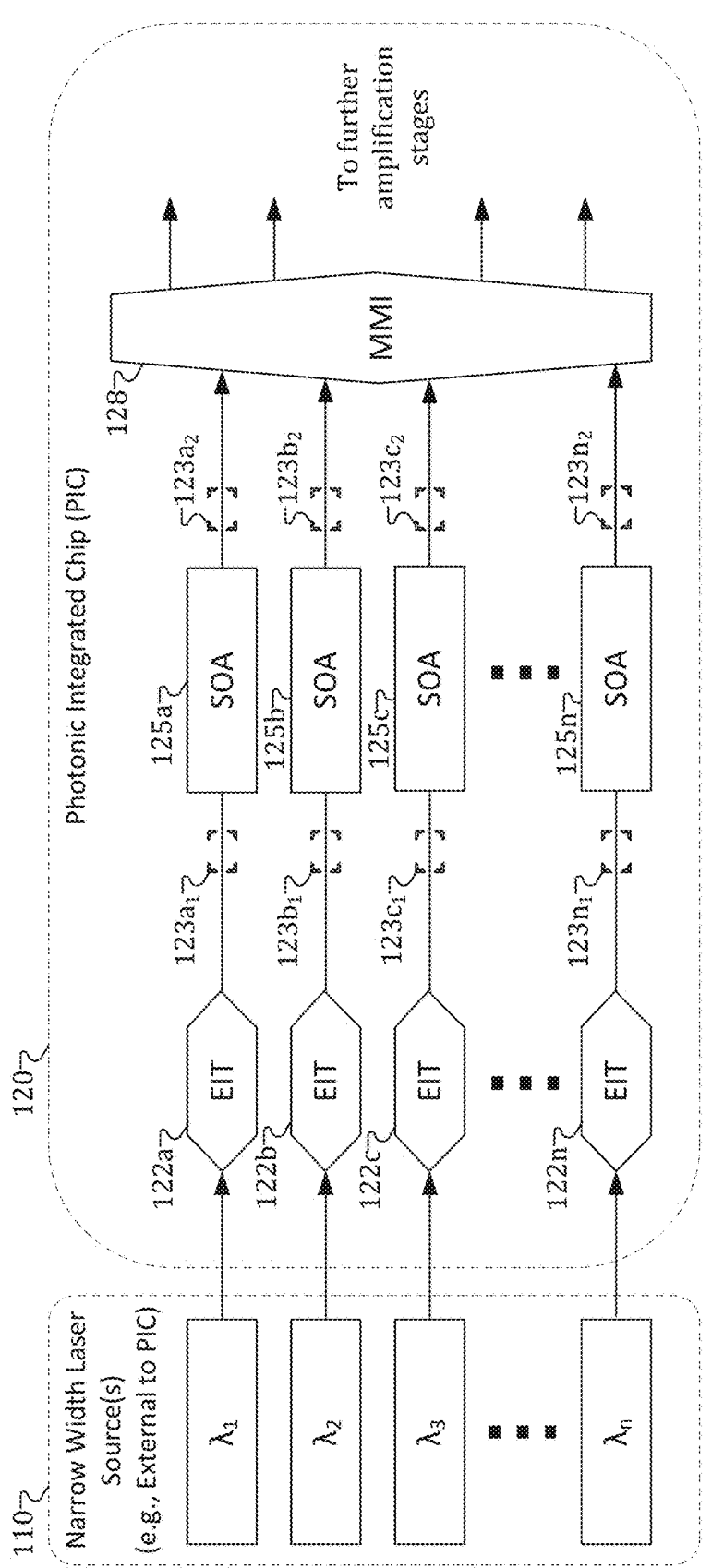
FIG. 1 shows an exemplary illustration of photonic integrated chip with switching semiconductor optical amplifiers for selectively amplifying different wavelengths of incident light.

The following detailed description refers to the accompanying drawings that show, by way of illustration, exemplary details and features.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As noted above, optical amplifier circuits are typically implemented in a photonic integrated chip (PIC) using an amplification stage of semiconductor-based optical amplifiers (also known as semiconductor optical amplifiers or SOAs) to amplify the incident light. In a LiDAR application, for example, a light source(s) may simultaneously emit pulses of light at multiple different wavelengths (e.g., through a grating), where each different, emitted wavelength of light may target different parts of the field of view (e.g., individual wavelengths may target different azimuth angles) at the same time. Thus, the optical amplifier circuit must selectively (e.g., in a sequential manner) amplify an individual one of the multiple different optical wavelengths of incident light, switching between amplifying one optical wavelength at one time and then amplifying a different optical wavelength at the next time. If more than one optical wavelength of incident light is allowed to pass through the optical amplifier circuit at the same time, this could negatively impact performance, manifesting as illuminations and/or reflections from portions of the field of view that are not targeted by the wavelength of light selected for amplification, ghost signals, and/or degraded signal-to-noise ratio.

As should be apparent from the detailed disclosure below, the disclosed optical amplifier circuit may reduce the risk of these performance impacts by efficiently switching between selectively amplifying a particular wavelength of light while extinguishing other incident wavelengths of light. In addition, while conventional optical amplifier circuits may include, before the amplification stage, a dedicated switching stage inside the PIC with switching/modulator components for optical switching, the disclosed optical amplifier circuits use SOAs for switching and amplification, where the SOAs amplify a selected optical wavelength while extinguishing the remainder of unwanted wavelengths. Examples of conventional switching/modulator components include silicon (Si) P-N junction-based optical switches that employ free-carrier absorption to attenuate an unwanted optical signal; Si Mach-Zehnder interferometers that attenuate the optical signal by leveraging path (and phase) difference between the two constituent arms that combine the split light using destructive interference; and Si ring resonators that attenuate an unwanted optical signal by diverting incoming light from the "through port" to the "drop port" by utilizing the ring's diameter, loss per length, phase, coupling factor, etc.

The disclosed optical amplifier circuit may have certain advantages over traditional switching/modulator components. Indeed, traditional photonic components typically rely on a feedback loop that requires constant monitoring and tuning across temperature and wavelength to ensure that the photonic components are set to the correct operating point for high extinction, leading to additional circuit complexity and cost. Moreover, traditional photonic components may require complex driver circuits to apply proper attenuation at the target wavelength. Traditional photonic components may also introduce insertion losses at the switching stage, the magnitude of which may depend on the particular switching circuit design. By contrast, the disclosed optical amplifier circuit uses switching semiconductor optical amplifiers (switching SOAs or SSOAs) that provide for optical amplification as well as switching, which may avoid the extra complexity, extra circuit space, and/or extra power that may be required by traditional, dedicated switching/modulator components.

FIG. 1 shows an exemplary illustration of an optical amplifier circuit 120 that may be or be part of a photonic integrated chip (PIC). The optical amplifier circuit 120 may be designed to simultaneously receive incident light at a single wavelength or multiple different wavelengths. The incident light may have been generated by, for example, narrow width light source(s) 110 (e.g., laser light source/ sources). As shown in the example of FIG. 1, the generated multiple different wavelengths of light are labeled as $\lambda_1$, $\lambda_2$, $\lambda_3$, . . . $\lambda_n$, and may be emitted by a laser or lasers that are, for example, part of a LiDAR sensor that operates with multiple channels. Each channel may be associated with a corresponding wavelength of the multiple different wavelengths and may be designed to target different portions of the field of view of the LiDAR sensor (e.g., different azimuth angles, different sectors, different areas, etc.) at the same time. The optical amplifier circuit 120 may be configurable to select an individual channel at a given time (e.g. sequentially selecting individual channels at different times) and amplify its corresponding wavelength of light while extinguishing the wavelengths of light associated with the unselected channels. The amplified output of the optical amplifier circuit 120 may include only the selected wavelength (e.g., exactly one) while attenuating (e.g., fully) the remainder of the incident wavelengths.

While optical amplifier circuit 120 has been depicted in FIG. 1 with just four channels, each corresponding to one of four different wavelengths of light, the optical amplifier circuit 120 may include any number of channels, where each channel may be associated with a different one of the multiple different wavelengths of light. As should also be appreciated, while the examples herein generally discuss multiple different wavelengths of light, each channel being associated with a different (e.g., distinct) wavelength of light, multiple channels (e.g., groups of channels or all of the channels) may be configured to amplify the same, predefined wavelength of light. In such a case, by selecting or unselecting the individual channels at the predefined wavelength, the optical amplifier circuit 120 may adjust the amplification level at that predefined wavelength.

The input of the optical amplifier circuit 120 may include multiple input ports for receiving and conducting the incident light. Each input port may be or include an edge inverted taper (EIT) for receiving the incident light and guiding it into the PIC (e.g., EITs 122a-122n, one for each channel (e.g., channels 1-n) associated with conducting a corresponding wavelength (e.g., one of wavelengths $\lambda_1$-$\lambda_n$)). As should be appreciated, while multiple input ports are shown (e.g., one EIT per channel), a single input port may be used along with an arrayed waveguide that separates incident wavelengths into a corresponding channel.

Each edge inverted taper (e.g., EITs 122a-122n) may then feed into a corresponding switching semiconductor optical amplifier (e.g., SSOAs 125a-125n) for either amplifying the corresponding wavelength or extinguishing it, depending on which of the incident wavelengths of light the amplifier circuit 120 is configured to selectively amplify. SSOAs 125a-125n may be long cavity switching SOAs, where the cavity length may be, for example, 1500 microns or more. The outputs of the switching semiconductor optical amplifiers (e.g., SSOAs 125a-125n) may then be combined in a splitting circuit (e.g., multimode interferometer (MMI) 128) that splits the amplified signal multiple ways at its output, where each split signal may then be fed into one or more additional amplification stages for further amplification and/ or processing of the selected wavelength. As should be appreciated, while MMI 128 is depicted as a 4×4 MMI that receives four channels and splits the combined signal into four output signals, any MMI may be used that may combine any number of received signals and split the combined signal into any number of output signals.

The optical amplifier circuit 120 may also include one or more photodiodes (e.g., photodiodes $123a_1$, $123a_2$ through $123n_1$, $123n_2$) at the input and/or output of each SSOA 125a-125n for monitoring the amplification level of the SSOA. For example, photodiode $123a_1$ may be located near the input of the SSOA 125a for measuring the optical signal level at the input of the SSOA 125a while photodiode $123a_2$ may be located near the output of the SSOA 125a for measuring the optical signal level at the output of the SSOA 125a. The difference between the output optical signal level measured at photodiode $123a_2$ and the input optical signal level measured at photodiode $123a_1$ may indicate the extent of optical amplification (or absorption/attenuation) through SSOA 125a. Then, the optical amplifier circuit 120 may use the measured level of amplification to adjust the driver current that is supplied to the SSOA 125a in order to adjust the level of amplification or absorption/attenuation (e.g., using open-loop or closed-loop control). As should be appreciated, each of the switched optical amplifiers (e.g., SSOAs 125a-125n) may have its own photodiode(s) for monitoring the amplification/attenuation level of the switched optical amplifier in order to allow for individually measuring and adjusting the driver current to each of the SSOAs 125a-125n.

As noted earlier, the optical amplifier circuit 120 may selectively switch each of the SSOAs 125a-125n to either amplify or attenuate/absorb its corresponding optical wavelength, depending on which channel is selected for amplification. This means that the optical amplifier circuit 120 may select one (e.g., exactly one) optical wavelength for amplification and then extinguish the remainder. For example, if the optical amplifier circuit 120 selects the channel associated with wavelength $\lambda_3$ for amplification, then it may switch SSOA 125c to an amplification mode in order to amplify optical signals of wavelength $\lambda_3$ while also switching the remaining SSOAs 125a, 125b . . . 125n to an absorption mode to attenuate the remaining wavelengths. In this manner, an amplified signal of wavelength $\lambda_3$ is transmitted to the MMI 128 while the signals of wavelengths $\lambda_1$, $\lambda_2$ and $\lambda_n$ are attenuated/absorbed by its corresponding one of SSOAs 125a, 125b, 125n and not transferred to MMI 128.

To select between operation of each SSOA in the amplification mode or the absorption mode, the optical amplifier circuit 120 may adjust the biasing of each SSOA individually. For example, the optical amplifier circuit 120 may set an SSOA to the amplification mode by forward biasing the SSOA. In addition, the optical amplifier circuit 120 may set the SSOA to the attenuation/absorption mode by grounding or reverse-biasing the SSOA. Thus, by forward biasing a selected one of the SSOAs and grounding or reverse-biasing the remaining SSOAs, the optical amplifier circuit 120 may select which individual one of the optical wavelengths is amplified at a given time. Then, at a different point in time, the optical amplifier circuit 120 may switch to select a different one of the optical wavelengths by forward biasing a different one of the SSOAs while grounding or reverse-biasing the remaining SSOAs.

As should be appreciated, the timing (e.g., at what time and for what duration) each wavelength is selected for individual amplification (and therefore which individual switching SOA is forward-biased while which of the other switching SSOAs are grounded or reverse-based) may depend on the application in which the optical amplifier circuit 120 is used and in what environment. For example, in a LiDAR application, narrow width laser source(s) 120 may emit light simultaneously at different wavelengths (e.g., wavelengths $\lambda_1$, $\Delta_2$, $\lambda_n$; etc.), each associated with a different field of view for the LiDAR sensor (e.g., each different wavelength may correspond to a different azimuth angle). To accurately sense each different field of view, the optical amplifier circuit 120 may selectively amplify only one wavelength at a given time. For example, to render the field of view associated with a first wavelength of light (e.g., wavelength $\lambda_1$ and channel 1), the optical amplifier circuit 120 may configure SOA 125a to the amplification mode while setting the remaining SSOAs 125b-125n to the attenuation mode. To render the field of view associated with channel 2 (e.g., wavelength $\lambda_2$ and channel 2), the optical amplifier circuit 120 may configure SSOA 125b to the amplification mode while setting the remaining SSOAs 125a, 125c-125n to the attenuation mode. In this manner, only one wavelength of the incident light may be amplified at a given time and passed to the MMI 128 to be split for further processing/amplification stages.

Figure 2:
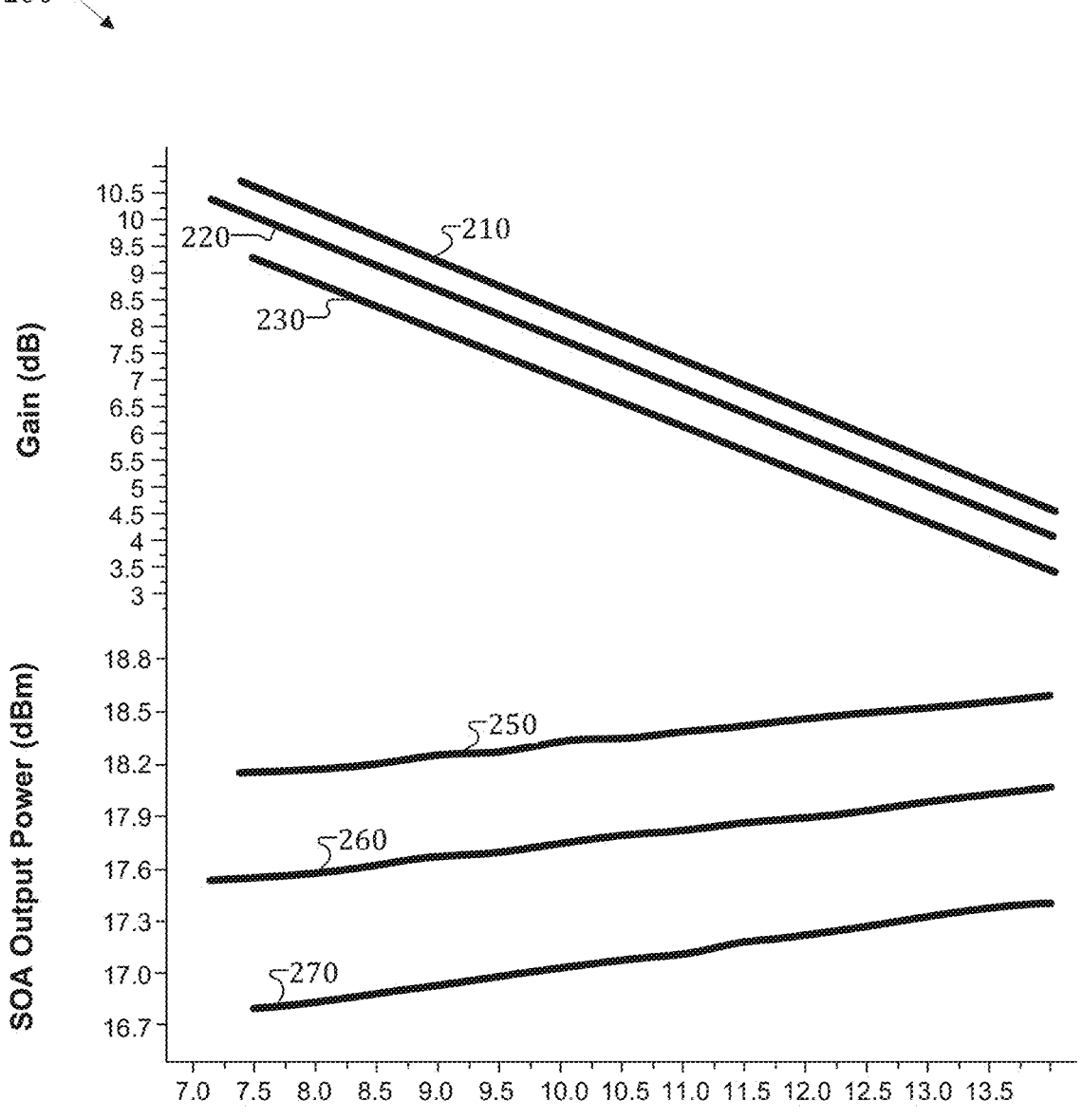
FIG. 2 shows an exemplary plot of a switching semiconductor optical amplifier in amplification mode.

FIG. 2 shows a plot 200 of an exemplary switching semiconductor optical amplifier's gain (curves 110, 120, 130) and output power (curves 150, 160, 170) as a function of the input optical power and forward bias current. The plot of FIG. 2 represents an SSOA configured in amplification mode, where curves 110 and 150 are at a bias current of approximately 200 mA, curves 120 and 160 are at a bias current of approximately 175 mA, and curves 130 and 170 are at a bias current of approximately 150 mA. In FIG. 2, the optical input power injected into the SSOA sweeps from approximately 7 dBm to 14 dBm, showing the corresponding gain and output power. As can be seen by the gain and output power as compared to the input power, the SSOA provides amplification when forward biased.

Figure 3:
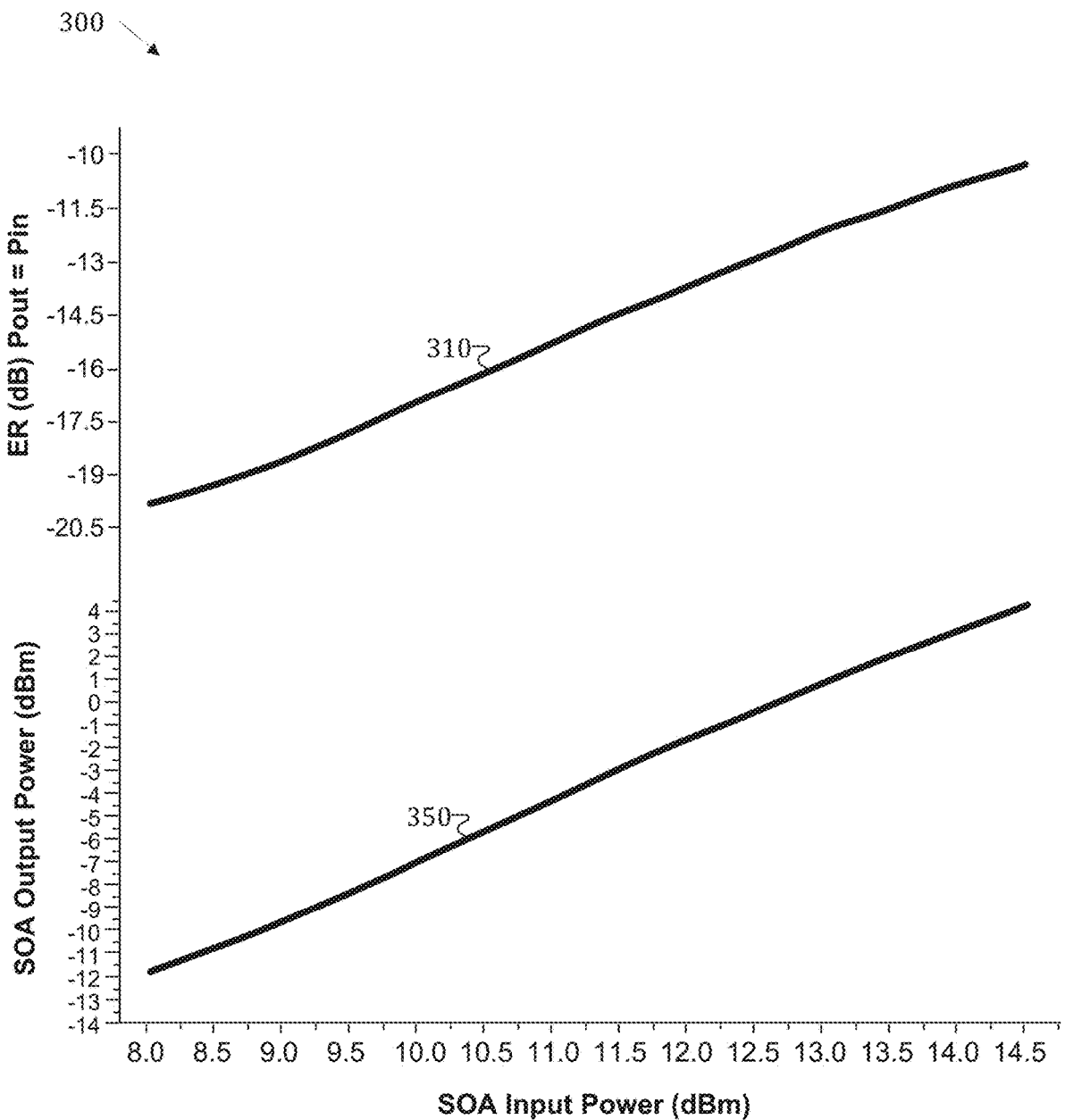
FIG. 3 shows an exemplary plot of a exemplary switching semiconductor optical amplifier in absorption mode.

FIG. 3 shows a plot 300 of an exemplary switching semiconductor optical amplifier's extinction ratio (ER) curve 310 and output power curve 350 as a function of the input optical power. The plot of FIG. 3 represents an SSOA configured in absorption mode, where the SSOA is grounded (e.g., the bias is set to 0 V). In FIG. 3, the optical input power injected into the SSOA sweeps from approximately 8 dBm to 14.5 dBm. As can be seen by the extinction ratio and output power as compared to the input power, the SSOA attenuates/absorbs the corresponding wavelength when grounded. As should be appreciated, like grounding the SSOA, the SSOA may also be negative biased in order to attenuate/absorb the corresponding wavelength, where the negative bias may be adjusted (e.g., increased/decreased) so as to tune the extent of attenuation/absorption of the SSOA. In addition, the design of the SSOA itself may impact the absorption coefficient of the SSOA, and the absorption coefficient may be increased (and thus increasing the extinction ratio) by adjusting SSOA design parameters, including, for example, increasing the number of quantum wells, decreasing the bandgap energy of the quantum well material, increasing the thickness of the quantum well layers, increasing the length of the active (amplifier/absorption) medium along the axis of propagation, and/or increasing the reverse bias across the SSOA to increase the depletion width and strength of electric field.

Figure 4:
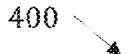
FIG. 4 shows an exemplary plot of time domain data for a switching semiconductor optical amplifier that switches between an absorption mode and an amplification mode under a switching frequency of approximately 100 kHz.
Figure 4:
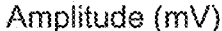
Figure 4:
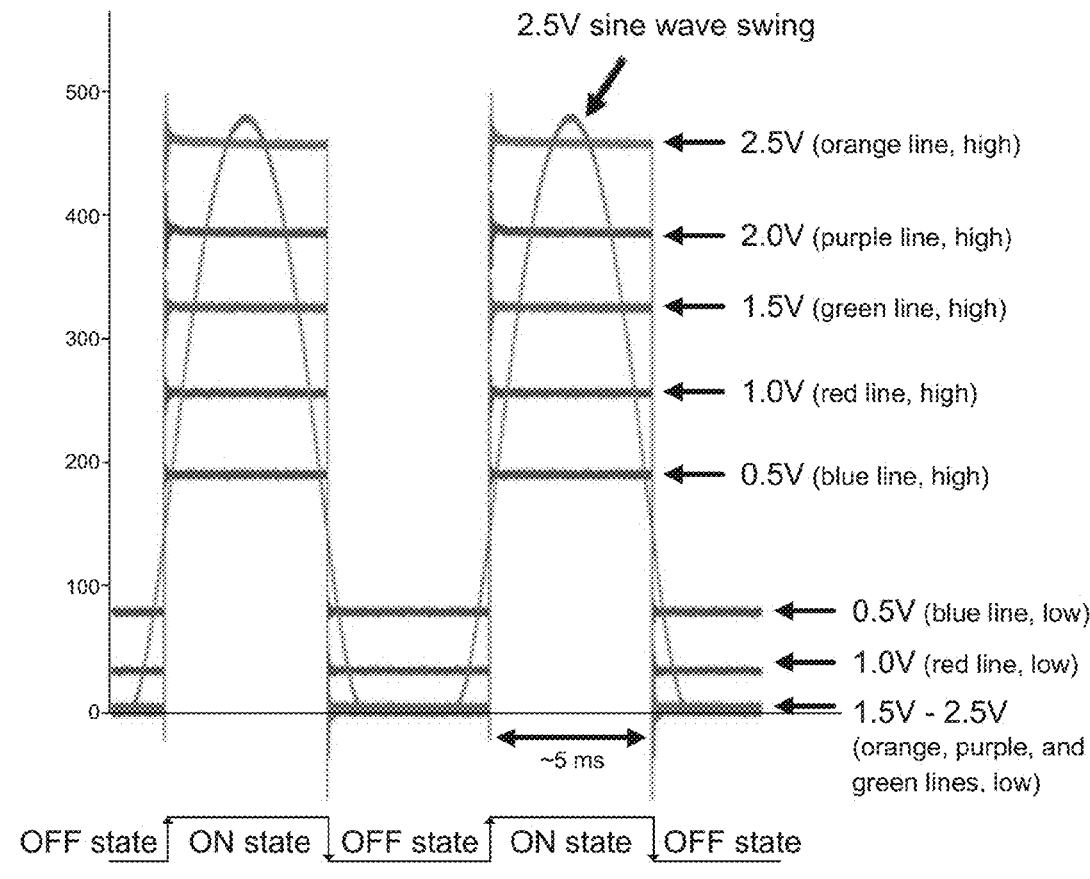

FIG. 4 shows a plot 400 of time domain data for an exemplary switching semiconductor optical amplifier that is being switched between an absorption mode and an amplification mode with a 100 kHz square wave (at 50% duty cycle) being applied as a bias voltage across the SSOA. This causes the SSOA to switch modes (e.g., from an absorption mode to an amplification mode or vice versa) every 5 milliseconds. FIG. 4 plots five different square waves that are applied to bias the SSOA, including at 0.5 V (represented by the blue line), 1.0 V (represented by the red line), 1.5 V (represented by the green line), 2.0 V (represented by the purple line), and 2.5 V (represented by the orange line) The Y-axis shows the high and low voltage amplitudes of the various applied square waves, where the amplitude is plotted as the super-position of the voltage amplitude of the applied signal, which includes an alternating current (AC) signal component and a direct current (DC) bias. The AC signal is defined by the peak voltage amplitude. The DC bias is 1.2 V. For reference, a 2.5 V sine wave swing is also shown. As can be seen, the SSOA is able to quickly switch between modes (e.g., from the OFF state (e.g., absorption mode) to the ON state (e.g., amplification mode), and vice-versa) with little impact to the shape of the applied signal, meaning the SSOA demonstrates a low resistance-capacitance (RC) time constant as the SSOA transitions between modes. If the RC time constant were higher, the bias current of the SSOA would struggle to follow the shape of the wave that is applied as a bias voltage across the SSOA and the signal would be distorted, meaning it may not handle fast transitions. As is apparent from FIG. 4, where the square wave transitions are relatively sharp, the disclosed switching semiconductor optical amplifier may quickly switch between modes without distorting the signal.

Figure 5:
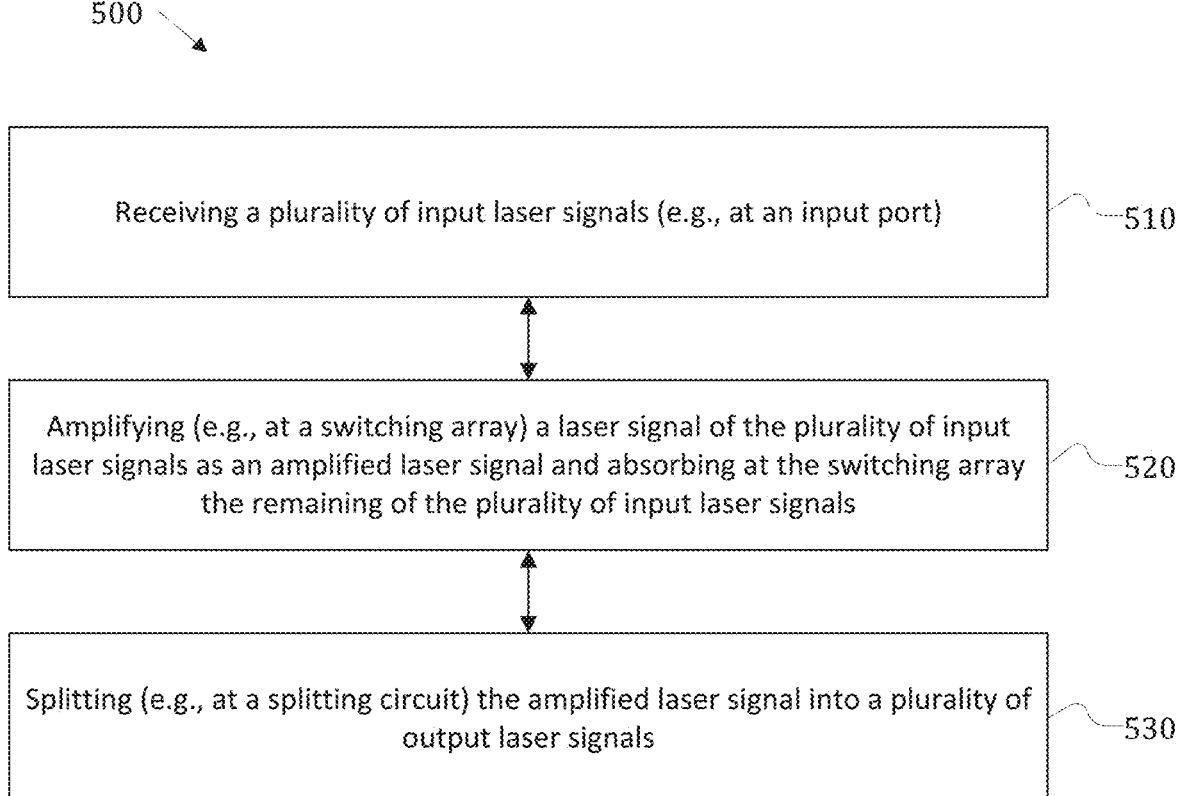
FIG. 5 depicts a schematic flow diagram of an exemplary method for using switching amplifiers for selectively amplifying at different wavelengths of incident light.

FIG. 5 is a schematic drawing illustrating a method 500 for providing selective amplification of a desired wavelength of incident light. The method 500 may include any of the features of the optical amplifier circuits described above with respect to FIGS. 1-4.

Method 500 includes, in 510, receiving a plurality of input laser signals (e.g., at an input port). Method 500 also includes, in 520, amplifying (e.g., at a switching array) a laser signal of the plurality of input laser signals as an amplified laser signal and absorbing at the switching array the remaining of the plurality of input laser signals. Method 500 also includes, in 530, splitting (e.g., at the splitting circuit) the amplified laser signal into a plurality of output laser signals.

In the following, various examples are provided that may include one or more aspects described above with reference to features of the disclosed optical circuit for providing selective amplification of a desired wavelength of incident light, including any of the features of the optical amplifier circuits described with respect above with respect to FIGS. 1-5. The examples provided in relation to the devices may apply also to the described method(s), and vice versa.

Example 1 is an optical circuit including an input port configured to receive a plurality of input laser signals. The optical circuit also includes a switching array including a plurality of switching optical amplifiers, wherein the switching array is connected to the input port and configured to amplify a laser signal of the plurality of input laser signals as an amplified laser signal and absorb the remaining of the plurality of input laser signals. The optical circuit also includes a splitting circuit connected to the switching array, wherein the splitting circuit is configured to split the amplified laser signal into a plurality of output laser signals.

Example 2 is the optical circuit of example 1, wherein the plurality of input laser signals comprise different (e.g., distinct) wavelengths, wherein each corresponding switching optical amplifier of the plurality of switching optical amplifiers is associated with a corresponding wavelength of the different wavelengths and is configurable between an amplification mode and an absorption mode with respect to the corresponding wavelength.

Example 3 is the optical circuit of example 2, wherein the amplification mode includes the corresponding switching optical amplifier configured to amplify laser signals with the corresponding wavelength, wherein the absorption mode includes the corresponding switching optical amplifier configured to absorb laser signals with the corresponding wavelength.

Example 4 is the optical circuit of example 2, wherein the amplification mode includes the corresponding switching optical amplifier biased with a drive current for amplifying the corresponding wavelength, wherein the absorption mode includes the corresponding switching optical amplifier biased to ground or reversed biased.

Example 5 is the optical circuit of any one of examples 1 and 3 to 4, wherein the plurality of input laser signals have a wavelength, wherein each corresponding switching optical amplifier of the plurality of switching optical amplifiers is associated with the wavelength and is configurable between an amplification mode and an absorption mode with respect to the wavelength.

Example 6 is the optical circuit of any one of examples 1 to 5, wherein the splitting circuit includes a multimode interferometer.

Example 7 is the optical circuit of any one of examples 1 to 6, the optical circuit further including an additional amplification circuit configured to further amplify each of the plurality of output laser signals.

Example 8 is the optical circuit of any one of examples 1 to 7, wherein the switching array configured to amplify the laser signal includes the switching array configured to amplify exactly one laser signal of the plurality of input laser signals as the amplified laser signal.

Example 9 is the optical circuit of any one of examples 1 to 8, wherein the switching array configured to absorb the remaining of the plurality of input laser signals includes the switching array configured to completely absorb the remaining of the plurality of input laser signals.

Example 10 is the optical circuit of any one of examples 1 to 9, wherein each of the plurality of switching optical amplifiers includes a long cavity switching optical amplifier.

Example 11 is the optical circuit of any one of examples 1 to 10, wherein each of the plurality of switching optical amplifiers includes a III-V switching optical amplifier.

Example 12 is the optical circuit of any one of examples 1 to 11, wherein each of the plurality of switching optical amplifiers is configurable between an amplification mode and an absorption mode based on a bias current that drives the switching optical amplifier, wherein in the amplification mode, the bias current includes a forward bias current and in the absorption mode, the bias current includes a negative bias current or a grounded bias current.

Example 13 is the optical circuit of any one of examples 1 to 12, wherein the input port includes a plurality of edge inverted taper couplers, wherein each edge inverted taper coupler of the plurality of edge inverted taper couplers is connected to a corresponding one of the plurality of switching optical amplifiers for guiding one of the plurality of input laser signals to the corresponding switching optical amplifier.

Example 14 is the optical circuit of example 13, wherein each of the plurality of input laser signals comprise different (e.g., distinct) wavelengths, wherein the one of the plurality of input laser signals includes a predefined wavelength of the plurality of different wavelengths.

Example 15 is the optical circuit of any one of examples 1 to 14, the optical circuit further including, for each switching optical amplifier of the plurality of switching optical amplifiers, a monitor photo diode between the input port and an input node of the switching optical amplifier.

Example 16 is the optical circuit of any one of examples 1 to 15, the optical circuit further including for each switching optical amplifier of the plurality of switching optical amplifiers, a monitor photo diode between the splitting circuit and an output node of the switching optical amplifier.

Example 17 is the optical circuit of any one of examples 2 to 16, wherein the switching array is configured to selectively switch in a predefined pattern one of the plurality of switching optical amplifiers to the amplification mode and the remainder of the plurality of switching optical amplifiers to the absorption mode.

Example 18 is the optical circuit of example 17, wherein the predefined pattern includes a sequential selection through each of the plurality of switching optical amplifiers.

Example 19 is the optical circuit of either of examples 17 or 18, wherein the switching array is configured to repeat the predefined pattern at a predefined frequency.

Example 20 is the optical circuit of example 19, wherein the predefined frequency includes 100 kHz.

Example 21 is the optical circuit of either of examples 19 or 20, wherein the predefined frequency includes a square wave pattern at a 50% duty cycle.

Example 22 is the optical circuit of any one of examples 2 to 21, wherein each switching optical amplifier of the plurality of switching optical amplifiers is configured to switch between the absorption mode and the amplification mode based on a bias current driving each switching optical amplifier of the plurality of switching optical amplifiers.

Example 23 is the optical circuit of example 22, wherein the bias current includes individual bias currents, each associated with a corresponding one of the plurality of switching optical amplifiers.

Example 24 is the optical circuit of example 23, wherein the switching array is configured to drive the each of the plurality of switching optical amplifiers with its corresponding individual bias current.

Example 25 is the optical circuit of any one of examples 1 to 24, wherein the switching array is configured to drive one of the plurality of switching optical amplifiers with a forward bias current to amplify the laser signal of the plurality of input laser signals and further configured to drive the remaining of the plurality of switching optical amplifiers to a negative bias current or a ground bias current to absorb the remaining of the plurality of input laser signals.

Example 26 is the optical circuit of any one of examples 1 to 25, wherein the laser signal of the plurality of input laser signals is at a first wavelength of a plurality of different (e.g., distinct) wavelengths and the remaining of the plurality of input laser signals are at other wavelengths of the plurality of different wavelengths, wherein the first wavelength is different from at least one (or each) of the other wavelengths.

Example 27 is the optical circuit of any one of examples 1 to 26, wherein the input port is further configured to simultaneously receive the plurality of input laser signals.

Example 28 is a method of operating an optical circuit that includes an input port, a switching array, and a splitting circuit. The method includes receiving a plurality of input laser signals (e.g., at the input port). The method also includes amplifying (e.g., at the switching array) a laser signal of the plurality of input laser signals as an amplified laser signal and absorbing at the switching array the remaining of the plurality of input laser signals. The method also includes splitting (e.g., at the splitting circuit) the amplified laser signal into a plurality of output laser signals.

Example 29 is the method of example 28, wherein each of the plurality of input laser signals comprise different (e.g., distinct) wavelengths, wherein each corresponding switching optical amplifier of the plurality of switching optical amplifiers is associated with a corresponding wavelength of the different wavelengths and is configurable between an amplification mode and an absorption mode with respect to the corresponding wavelength.

Example 30 is the method of example 29, wherein the amplification mode includes the corresponding switching optical amplifier configured to amplify laser signals with the corresponding wavelength, wherein the absorption mode includes the corresponding switching optical amplifier configured to absorb laser signals with the corresponding wavelength.

Example 31 is the method of example 29, wherein the amplification mode includes the corresponding switching optical amplifier biased with a drive current for amplifying the corresponding wavelength, wherein the absorption mode includes the corresponding switching optical amplifier biased to ground or reversed biased.

Example 32 is the method of any one of examples 28 and 30 to 31, wherein the plurality of input laser signals have a wavelength, wherein each corresponding switching optical amplifier of the plurality of switching optical amplifiers is associated with the wavelength and is configurable between an amplification mode and an absorption mode with respect to the wavelength.

Example 33 is the method of any one of examples 28 to 32, wherein the splitting circuit includes a multimode interferometer.

Example 34 is the method of any one of examples 28 to 33, the method further including further amplifying (e.g. via an additional amplification circuit) each of the plurality of output laser signals.

Example 35 is the method of any one of examples 28 to 34, wherein the amplifying the laser signal includes amplifying exactly one laser signal of the plurality of input laser signals as the amplified laser signal.

Example 36 is the method of any one of examples 28 to 35, wherein absorbing the remaining of the plurality of input laser signals includes completely absorbing the remaining of the plurality of input laser signals.

Example 37 is the method of any one of examples 28 to 36, wherein each of the plurality of switching optical amplifiers includes a long cavity switching optical amplifier.

Example 38 is the method of any one of examples 28 to 37, wherein each of the plurality of switching optical amplifiers includes a III-V switching optical amplifier.

Example 39 is the method of any one of examples 28 to 38, wherein each of the plurality of switching optical amplifiers is configurable between an amplification mode and an absorption mode based on a bias current that drives the switching optical amplifier, wherein in the amplification mode, the bias current includes a forward bias current and in the absorption mode, the bias current includes a negative bias current or a grounded bias current.

Example 40 is the method of any one of examples 28 to 39, the method further including guiding one of the plurality of input laser signals to the corresponding switching optical amplifier (e.g., via a plurality of edge inverted taper couplers at the input port, wherein each edge inverted taper coupler of the plurality of edge inverted taper couplers is connected to a corresponding one of the plurality of switching optical amplifiers).

Example 41 is the method of example 40, wherein each of the plurality of input laser signals are at different (e.g., distinct) wavelengths, wherein the one of the plurality of input laser signals includes a predefined wavelength of the plurality of different wavelengths.

Example 42 is the method of any one of examples 28 to 41, the optical circuit further including, for each switching optical amplifier of the plurality of switching optical amplifiers, a monitor photo diode between the input port and an input node of the switching optical amplifier.

Example 43 is the method of any one of examples 28 to 42, the optical circuit further including for each switching optical amplifier of the plurality of switching optical amplifiers, a monitor photo diode between the splitting circuit and an output node of the switching optical amplifier.

Example 44 is the method of any one of examples 29 to 43, the method further including selectively switching (e.g., via the switching array) in a predefined pattern one of the plurality of switching optical amplifiers to the amplification mode and the remainder of the plurality of switching optical amplifiers to the absorption mode.

Example 45 is the method of example 44, wherein the predefined pattern includes a sequential selection through each of the plurality of switching optical amplifiers.

Example 46 is the method of either of examples 44 or 45, the method further including repeating the predefined pattern at a predefined frequency.

Example 47 is the method of example 46, wherein the predefined frequency includes 100 kHz.

Example 48 is the method of either of examples 46 or 47, wherein the predefined frequency includes a square wave pattern at a 50% duty cycle.

Example 49 is the method of any one of examples 29 to 48, the method further including switching between the absorption mode and the amplification mode based on a bias current driving each switching optical amplifier of the plurality of switching optical amplifiers.

Example 50 is the method of example 49, wherein the bias current includes individual bias currents, each associated with a corresponding one of the plurality of switching optical amplifiers.

Example 51 is the method of example 50, the method further including driving the each of the plurality of switching optical amplifiers with its corresponding individual bias current.

Example 52 is the method of any one of examples 28 to 51, the method further including driving one of the plurality of switching optical amplifiers with a forward bias current to amplify the laser signal of the plurality of input laser signals and further including driving the remaining of the plurality of switching optical amplifiers to a negative bias current or a ground bias current to absorb the remaining of the plurality of input laser signals.

Example 53 is the method of any one of examples 28 to 52, wherein the laser signal of the plurality of input laser signals is at a first wavelength of a plurality of different (e.g., distinct) wavelengths and the remaining of the plurality of input laser signals are at other wavelengths of the plurality of different wavelengths, wherein the first wavelength is different from at least one (or each) of the other wavelengths.

Example 54 is the method of any one of examples 28 to 53, the method further including simultaneously receiving the plurality of input laser signals (e.g., at the input port).

Example 55 is device including an input means for receiving a plurality of input laser signals. The device also includes a switching means for switching among a plurality of optical amplification means, wherein the switching means is connected to the input means and configured to amplify a laser signal of the plurality of input laser signals as an amplified laser signal and absorb the remaining of the plurality of input laser signals. The device also includes a splitting means connected to the switching array, wherein the splitting means is configured to split the amplified laser signal into a plurality of output laser signals.

Example 56 is the device of example 55, wherein each of the plurality of input laser signals comprise different (e.g., distinct) wavelengths, wherein each corresponding optical amplification means of the plurality of optical amplification means is associated with a corresponding wavelength of the different wavelengths and is configurable between an amplification mode and an absorption mode with respect to the corresponding wavelength.

Example 57 is the device of example 56, wherein the amplification mode includes the corresponding optical amplification means configured to amplify laser signals with the corresponding wavelength, wherein the absorption mode includes the corresponding optical amplification means configured to absorb laser signals with the corresponding wavelength.

Example 58 is the device of example 56, wherein the amplification mode includes the corresponding optical amplification means biased with a drive current for amplifying the corresponding wavelength, wherein the absorption mode includes the corresponding optical amplification means biased to ground or reversed biased.

Example 59 is the device of any one of examples 55 and 57 to 58, wherein each of the plurality of input laser signals are at a wavelength, wherein each corresponding optical amplification means of the plurality of optical amplification means is associated with the wavelength and is configurable between an amplification mode and an absorption mode with respect to the wavelength.

Example 60 is the device of any one of examples 55 to 59, wherein the splitting means includes a multimode interferometer.

Example 61 is the device of any one of examples 55 to 60, the device further including an additional amplification means configured to further amplify each of the plurality of output laser signals.

Example 62 is the device of any one of examples 55 to 61, wherein the switching means configured to amplify the laser signal includes the switching means configured to amplify exactly one laser signal of the plurality of input laser signals as the amplified laser signal.

Example 63 is the device of any one of examples 55 to 62, wherein the switching means configured to absorb the remaining of the plurality of input laser signals includes the switching means configured to completely absorb the remaining of the plurality of input laser signals.

Example 64 is the device of any one of examples 55 to 63, wherein each of the plurality of optical amplification means includes a long cavity switching optical amplifier.

Example 65 is the device of any one of examples 55 to 64, wherein each of the plurality of optical amplification means includes a III-V switching optical amplifier.

Example 66 is the device of any one of examples 55 to 65, wherein each of the plurality of optical amplification means is configurable between an amplification mode and an absorption mode based on a bias current that drives the optical amplification means, wherein in the amplification mode, the bias current includes a forward bias current and in the absorption mode, the bias current includes a negative bias current or a grounded bias current.

Example 67 is the device of any one of examples 55 to 66, wherein the input means includes a plurality of edge inverted taper couplers, wherein each edge inverted taper coupler of the plurality of edge inverted taper couplers is connected to a corresponding one of the plurality of optical amplification means for guiding one of the plurality of input laser signals to the corresponding optical amplification means.

Example 68 is the device of example 67, wherein each of the plurality of input laser signals are at different (e.g., distinct) wavelengths, wherein the one of the plurality of input laser signals includes a predefined wavelength of the plurality of different wavelengths.

Example 69 is the device of any one of examples 55 to 68, the device further including, for each optical amplification means of the plurality of optical amplification means, a laser light monitoring means between the input means and an input node of the optical amplification means.

Example 70 is the device of any one of examples 55 to 69, the device further including for each optical amplification means of the plurality of optical amplification means, a lase light monitoring means between the splitting means and an output node of the optical amplification means.

Example 71 is the device of any one of examples 56 to 70, wherein the switching means is configured to selectively switch in a predefined pattern one of the plurality of optical amplification means to the amplification mode and the remainder of the plurality of optical amplification means to the absorption mode.

Example 72 is the device of example 71, wherein the predefined pattern includes a sequential selection through each of the plurality of optical amplification means.

Example 73 is the device of either of examples 71 or 72, wherein the switching means is configured to repeat the predefined pattern at a predefined frequency.

Example 74 is the device of example 73, wherein the predefined frequency includes 100 kHz.

Example 75 is the device of either of examples 73 or 74, wherein the predefined frequency includes a square wave pattern at a 50% duty cycle.

Example 76 is the device of any one of examples 56 to 75, wherein each optical amplification means of the plurality of optical amplification means is configured to switch between the absorption mode and the amplification mode based on a bias current driving each optical amplification means of the plurality of optical amplification means.

Example 77 is the device of example 76, wherein the bias current includes individual bias currents, each associated with a corresponding one of the plurality of optical amplification means.

Example 78 is the device of example 77, wherein the switching means is configured to drive the each of the plurality of optical amplification means with its corresponding individual bias current.

Example 79 is the device of any one of examples 55 to 78, wherein the switching means is configured to drive one of the plurality of optical amplification means with a forward bias current to amplify the laser signal of the plurality of input laser signals and further configured to drive the remaining of the plurality of optical amplification means to a negative bias current or a ground bias current to absorb the remaining of the plurality of input laser signals.

Example 80 is the device of any one of examples 55 to 79, wherein the laser signal of the plurality of input laser signals is at a first wavelength of a plurality of different (e.g., distinct) wavelengths and the remaining of the plurality of input laser signals are at other wavelengths of the plurality of different wavelengths, wherein the first wavelength is different from at least one (or each) of the other wavelengths.

Example 81 is the device of any one of examples 55 to 80, wherein the input means is further configured to simultaneously receive the plurality of input laser signals.

While the disclosure has been particularly shown and described with reference to specific aspects, it should be understood by those skilled in the art that various changes in form and detail may be made therein without departing from the spirit and scope of the disclosure as defined by the appended examples. The scope of the disclosure is thus indicated by the appended examples and all changes, which come within the meaning and range of equivalency of the examples, are therefore intended to be embraced.

The invention claimed is:

1. An optical circuit comprising:
an input port configured to receive a plurality of input laser signals;
a switching array comprising a plurality of switching optical amplifiers, wherein the switching array is connected to the input port and configured to amplify a laser signal of the plurality of input laser signals as an amplified laser signal and absorb the remaining of the plurality of input laser signals; and
a splitting circuit connected to the switching array, wherein the splitting circuit is configured to split the amplified laser signal into a plurality of output laser signals.

2. The optical circuit of claim 1, wherein the plurality of input laser signals comprise different wavelengths, wherein each corresponding switching optical amplifier of the plurality of switching optical amplifiers is associated with a corresponding wavelength of the different wavelengths and is configurable between an amplification mode and an absorption mode with respect to the corresponding wavelength.

3. The optical circuit of claim 2, wherein the amplification mode comprises the corresponding switching optical amplifier configured to amplify laser signals with the corresponding wavelength, wherein the absorption mode comprises the corresponding switching optical amplifier configured to absorb laser signals with the corresponding wavelength.

4. The optical circuit of claim 2, wherein the amplification mode comprises the corresponding switching optical amplifier biased with a drive current for amplifying the corresponding wavelength, wherein the absorption mode comprises the corresponding switching optical amplifier biased to ground or reversed biased.

5. The optical circuit of claim 1, wherein the splitting circuit comprises a multimode interferometer.

6. The optical circuit of claim 1, the optical circuit further comprising an additional amplification circuit configured to further amplify each of the plurality of output laser signals.

7. The optical circuit of claim 1, wherein the switching array configured to amplify the laser signal comprises the switching array configured to amplify exactly one laser signal of the plurality of input laser signals as the amplified laser signal.

8. The optical circuit of claim 1, wherein the switching array configured to absorb the remaining of the plurality of input laser signals comprises the switching array configured to completely absorb the remaining of the plurality of input laser signals.

9. The optical circuit of claim 1, wherein each of the plurality of switching optical amplifiers comprises a long cavity switching optical amplifier.

10. The optical circuit of claim 1, wherein each of the plurality of switching optical amplifiers is configurable between an amplification mode and an absorption mode based on a bias current that drives the switching optical amplifier, wherein in the amplification mode, the bias current comprises a forward bias current and in the absorption mode, the bias current comprises a negative bias current or a grounded bias current.

11. The optical circuit of claim 1, wherein the input port comprises a plurality of edge inverted taper couplers, wherein each edge inverted taper coupler of the plurality of edge inverted taper couplers is connected to a corresponding one of the plurality of switching optical amplifiers for guiding one of the plurality of input laser signals to the corresponding switching optical amplifier.

12. The optical circuit of claim 2, wherein the switching array is configured to selectively switch in a predefined pattern one of the plurality of switching optical amplifiers to the amplification mode and the remainder of the plurality of switching optical amplifiers to the absorption mode.

13. The optical circuit of claim 12, wherein the predefined pattern comprises a sequential selection through each of the plurality of switching optical amplifiers.

14. The optical circuit of claim 2, wherein each switching optical amplifier of the plurality of switching optical amplifiers is configured to switch between the absorption mode and the amplification mode based on a bias current driving each switching optical amplifier of the plurality of switching optical amplifiers.

15. The optical circuit of claim 14, wherein the bias current comprises individual bias currents, each associated with a corresponding one of the plurality of switching optical amplifiers.

16. The optical circuit of claim 15, wherein the switching array is configured to drive the each of the plurality of switching optical amplifiers with its corresponding individual bias current.

17. A device comprising:

an input means for receiving a plurality of input laser signals;

a switching means for switching among a plurality of optical amplification means, wherein the switching means is connected to the input means and configured to amplify a laser signal of the plurality of input laser signals as an amplified laser signal and absorb the remaining of the plurality of input laser signals;

a splitting means connected to the switching array, wherein the splitting means is configured to split the amplified laser signal into a plurality of output laser signals, the plurality of input laser signals comprise different wavelengths, wherein each corresponding optical amplification means of the plurality of optical amplification means is associated with a corresponding wavelength of the different wavelengths and is configurable between an amplification mode and an absorption mode with respect to the corresponding wavelength.

18. The device of claim 17, wherein the switching means is configured to drive one of the plurality of optical amplification means with a forward bias current to amplify the laser signal of the plurality of input laser signals and further configured to drive the remaining of the plurality of optical amplification means to a negative bias current or a ground bias current to absorb the remaining of the plurality of input laser signals.

19. The device of claim 17, wherein the laser signal of the plurality of input laser signals is at a first wavelength of a plurality of different wavelengths and the remaining of the plurality of input laser signals are at other wavelengths of the plurality of different wavelengths, wherein the first wavelength is different from at least one of the other wavelengths.

20. The device of claim 17, wherein the input means is further configured to simultaneously receive the plurality of input laser signals.

* * * * *